United States Patent [19]

Heumann et al.

[11] Patent Number: 5,111,137
[45] Date of Patent: May 5, 1992

[54] METHOD AND APPARATUS FOR THE DETECTION OF LEAKAGE CURRENT

[75] Inventors: John M. Heumann, Loveland, Colo.; Vance R. Harwood, Amstelveen, Netherlands

[73] Assignee: Hewlett-Packard Company, Palo Alto, Calif.

[21] Appl. No.: 605,289

[22] Filed: Oct. 29, 1990

[51] Int. Cl.$^5$ .............................................. G01R 31/00
[52] U.S. Cl. ........................... 324/158 R; 324/158 D; 324/537; 340/653
[58] Field of Search ........... 324/158 R, 158 D, 158 T, 324/537; 340/653

[56] References Cited

U.S. PATENT DOCUMENTS

| 4,575,676 | 3/1986 | Palkuti | 324/158 R |
| 4,588,945 | 5/1986 | Groves et al. | 324/158 |
| 4,588,946 | 5/1986 | Lin | 324/158 R |
| 4,644,264 | 2/1987 | Beha et al. | 324/158 D |
| 4,698,587 | 10/1987 | Burns et al. | 324/158 D |
| 4,712,063 | 12/1987 | Osterwald et al. | 324/158 D |
| 4,736,159 | 4/1988 | Shiragasawa et al. | 324/158 D |
| 4,779,041 | 10/1988 | Williamson, Jr. | 324/73 |
| 4,870,352 | 9/1989 | Koechner | 324/158 D |

Primary Examiner—Kenneth A. Wieder
Assistant Examiner—William J. Burns

[57] ABSTRACT

A method and apparatus for analyzing a semiconductor device having a diode formed therein. In its broadest sense, the invention involves irradiating the semiconductor device with electromagnetic radiation while monitoring the leakage current output from the diode contained in the semiconductor device. If the semiconductor device is present and properly soldered to the printed circuit board, an increase in the leakage current will be observed during the irradiation process. The increase in leakage current is also representative of the presence of intact bond wires at both the pin under test and the ground pin. The invention in a preferred form is shown to include a voltage source, electrically connected to the diode, for biasing the diode in a reverse direction, a current monitor, connected to monitor the leakage current from the diode and an electromagnetic radiation generator, positioned to provide electromagnetic radiation incident on the semiconductor device. It is preferred that the electromagnetic radiation be an ionizing radiation such as X-rays. However, such electromagnetic radiation can also be visible light, such as fluorescent light or incandescent light. In an especially preferred embodiment, the semiconductor device is first exposed to electromagnetic radiation, and thereafter the diode is biased in a reverse direction.

23 Claims, 1 Drawing Sheet

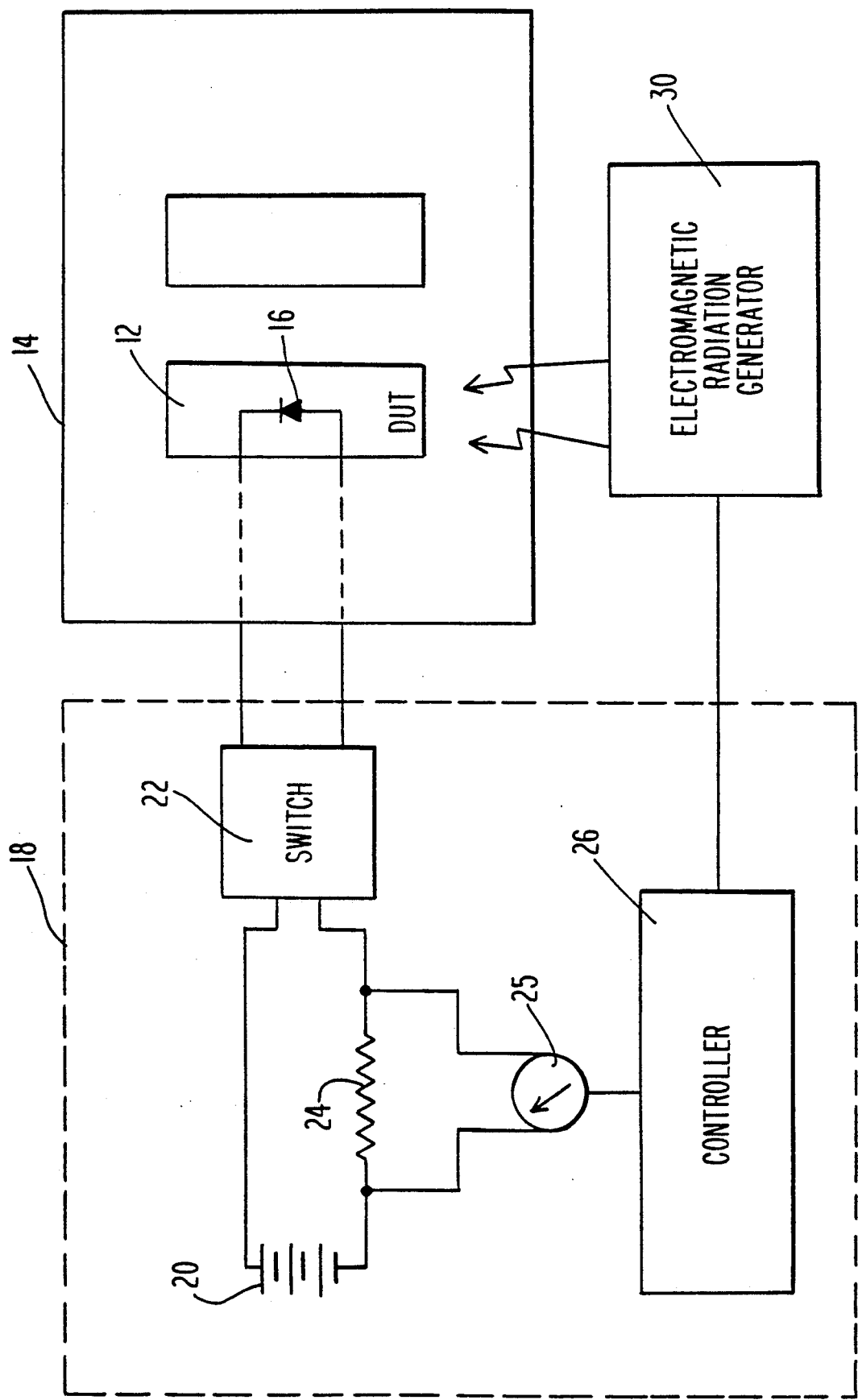

METHOD AND APPARATUS FOR THE DETECTION OF LEAKAGE CURRENT

FIELD OF THE INVENTION

The present invention relates to the field of circuit testing and more particularly to quality control testing of manufactured printed circuit assemblies to verify the presence of a part, the existence of a solder joint or the presence and condition of bondwires.

BACKGROUND OF THE INVENTION

As the use and complexity of printed circuit boards has increased, so also has the need to test such packages increased in order to ensure proper operation subsequent to manufacture. Basically, two types of printed circuit board test techniques have been developed for this form of quality control, namely functional test techniques and so-called in-circuit test techniques.

In functional test techniques a known digital pattern is applied to the circuit input and a comparison is made of the circuit output with an expected output. The differences between the actual and expected outputs provides an indication of circuit operation. Unfortunately, this technique is only useful when it is desirable to know the overall operation of a circuit. Very often it is necessary to test individual circuit elements or groups of elements which have been assembled onto a printed circuit board apart from the overall circuit operation.

In in-circuit testing techniques, testing is performed on a circuit element or elements isolated from the remainder of the circuit. In-circuit testing techniques generally involve the application of a preselected digital pattern to the input of an individual circuit element, a so-called device under test (DUT), and the comparison of the DUT response to an expected response. Since the circuit element or elements under test typically are connected to other circuit elements on a printed circuit board, it may be required to overdrive any digital pattern or signal which is being applied by an "upstream" circuit element or logic device. Upstream logic devices are those devices whose outputs normally drive the inputs of the DUT. An overdrive signal is a signal which is superimposed at a selected location in a circuit.

In order to perform multiple simultaneous in-circuit tests on several individual circuit elements mounted on a single printed circuit board, test devices such as that disclosed in U.S. Pat. No. 4,588,945 were developed. In such devices a printed circuit board having premounted circuit elements is in turn mounted or affixed to a so-called bed of nails. Each nail acts as an individual probe either providing a preselected signal to or receiving an output signal from a lead of a DUT. As described in that patent, a controller module applies multiple pregenerated signal patterns to multiple DUT leads through various driver modules. The DUT responses are received through sensor modules and compared to expected responses. In U.S. Pat. No. 4,588,945 methods and apparatus are disclosed which prevent damage to such DUTs or upstream devices during in-circuit testing.

Unfortunately, in-circuit testing techniques can be quite expensive to implement. When determining basic circuit information such as component presence, such sophisticated techniques are unwarranted. Simpler and less expensive techniques have been proposed to determine shorts and open connections on a printed circuit board, missing components and in certain circumstances bent connecting pins. U.S. Pat. No. 4,779,041 - Williamson, Jr. discloses one such system. In that patent, a current pulse is provided to one input of a semiconductor device under test. Application of the current pulse results in the forward biasing of the diode junction existing between the input and the ground lead. A test current is applied to another lead of the device, generating a voltage drop across the inherent resistance of the device. The application of the test current results in a decrease in the voltage at the input where the first current pulse was provided. Detection of this voltage decrease indicates not only the presence of a device, but also, that the input and output terminals, as well as the ground terminal of the device, are properly connected.

The problem with such purely electrical techniques is the potential for parallel electrical paths on the circuit board containing the devices being tested. Such parallel paths can result in induced currents in adjacent paths which can cause signal interference which in turn can lead to false indications of those conditions being tested. What is needed is a simple system for determining basic information about a device under test which avoids such parallel path problems.

SUMMARY OF THE INVENTION

The advantages of the invention are achieved in a method and apparatus for analyzing a semiconductor device having a diode formed therein. In its broadest sense, the invention involves irradiating the semiconductor device with electromagnetic radiation while monitoring the leakage current output from the diode contained in the semiconductor device. If the semiconductor device is present and properly soldered to the printed circuit board, an increase in the leakage current will be observed during the irradiation process. The increase in leakage current is also representative of the presence of intact bond wires at both the pin under test and the ground pin. The invention in a preferred form is shown to include a voltage source, electrically connected to the diode, for biasing the diode in a reverse direction, a current monitor, connected to monitor the leakage current from the diode and an electromagnetic radiation generator, positioned to provide electromagnetic radiation incident on the semiconductor device. It is preferred that the electromagnetic radiation be an ionizing radiation such as X-rays. However, other forms of electromagnetic radiation can also be used, such as that from fluorescent, incandescent, laser, or radioactive sources. In another embodiment, the semiconductor device is first exposed to electromagnetic radiation, and thereafter the diode is biased in a reverse direction.

BRIEF DESCRIPTION OF THE DRAWINGS

The present invention will be better understood, and its numerous objects and advantages will become apparent by reference to the following detailed description of the invention when taken in conjunction with the drawing, in which:

FIG. 1 a schematic diagram of a of the present invention.

DETAILED DESCRIPTION OF THE EMBODIMENTS

A new and novel apparatus for analyzing semiconductor devices, for example, in a manufacturing operation, is shown in FIG. 1 and generally designated 10. A semiconductor device 12 has been pre-mounted to a printed circuit board 14. The device being analyzed is shown to include a diode 16. Diode 16 typically will be a protection diode formed between the substrate and an input (protection diode) or output (parasitic diode) pin in an integrated circuit-type device.

Device 12 is being analyzed by tester 18. Tester 18 can form a portion of a functional or in-circuit tester or may be an independent tester unit constructed in accordance with the invention. Tester 18 is shown to include a battery or voltage source 20 which is electrically connected through switch 22 to diode 16. Current is monitored in the electrical connection between source 20 and diode 16 by any suitable method or device. In this embodiment, current is monitored by means of current sensing resistor 24. The current passing through resistor 24 is detected by measuring the voltage across resistor 24 with voltmeter 25. The measured voltage is provided to controller 26 which monitors the current in accordance with the invention. Controller 26 controls the operation of switch 22 and thereby controls the voltage applied to diode 16. In the preferred embodiment, when voltage is applied to diode 16, the diode is biased in a reverse direction.

Controller 26 is also shown to control electromagnetic radiation generator 30. In the preferred embodiment, generator 30 is positioned to provide electromagnetic radiation incident on the semiconductor device under test 12, but not on other devices. By collimating the electromagnetic radiation source, one can isolate a DUT for irradiation.

Analyzer 10 is used to detect part presence and the existence of proper lead connections for semiconductor devices which are pre-mounted on printed circuit boards. Such detection or analysis is accomplished by applying a reverse bias to diode 16, irradiating device 12 with electromagnetic radiation while monitoring the leakage current. If the part is present and if proper electrical connections exist, the leakage current will increase upon the generation of electromagnetic radiation. In one embodiment of the invention, the electromagnetic radiation provided device 12 is ionizing radiation such as x-rays. In an especially preferred embodiment, the x-rays provided have an intensity in the range from 10 to 20 kilo electro volts but higher energy x-rays may also be used. In a further embodiment of the present invention, the electromagnetic radiation comprises visible infrared, or ultraviolet light such as from a fluorescent or incandescent source. It will be noted that if such a source is used device 12 must have a transparent casing and cannot have an opaque casing, as is typical with semiconductor devices.

Before considering operation of the apparatus shown in FIG. 1, a discussion of the appropriate wavelength x-rays to be utilized and a discussion of the source intensity required, may be helpful. Consider first, appropriate wavelength x-rays to be utilized. Tables 1, 2 and 3 listed below detail wavelength and energy in terms of the fraction of photons absorbed, the energy absorbed per incident photon and the energy absorbed relative to that observed with 1Å x-rays. The generation of these tables was based on the assumption that 250 μm is typical for the thickness of a silicon wafer utilized in a semiconductor device and that 0.05 inches (1,270 μm) represents the thickness of the top half of the integrated circuit package. The composition and x-ray absorption characteristics of the package material will be quite variable. However, such absorption characteristics will most likely lie between the values for carbon and aluminum, i.e., the package casing will absorb more than carbon but less than aluminum. It is important to note that the goal is to choose an energy such that a reasonable fraction of the energy makes it through the package casing but is absorbed in the silicon die. It will be noticed in Tables 1, 2 and 3 that 10–20 keV x-rays are both absorbed by silicon strongly as well as passing through carbon fairly well. At 20 keV, roughly 40% of the x-rays will pass through 1,270 μm of aluminum. Higher energy x-rays pass through aluminum better, however, such x-rays are only weakly absorbed by the silicon die. It will be noted that the values listed in Tables 1, 2 and 3 were derived in relation to the following absorption formulas:

Attenuation of an x-ray beam is given by $$I = I_0 e^{\sigma_L x} \tag{1}$$

$$\sigma_A \sim C_o Z^4 \lambda^3 + B_o \tag{2}$$

$$\sigma_L = \rho N_A \circ \sigma_A \tag{3}$$

where $C_o = 2.25 m^{-1}$ and where $B_o$ is negligible except for the lightest elements and wavelengths less than 1Å. $\sigma_A$ and $\sigma_L$ are referred to as the "atomic absorption coefficient" and the "absorption coefficient", respectively.

TABLE 1

| Absorption table for 250 uM thick silicon | | | | |
|---|---|---|---|---|
| λ (angstroms) | Energy (keV) | Fraction Absorbed | Energy Absorbed | Relative Absorption |
| 1.5 | 8.3 | 0.98 | 8.1 | 0.97 |
| 1.4 | 8.9 | 0.95 | 8.4 | 1.01 |
| 1.3 | 9.5 | 0.91 | 8.7 | 1.05 |
| 1.2 | 10.3 | 0.85 | 8.8 | 1.06 |
| 1.1 | 11.3 | 0.77 | 8.7 | 1.05 |
| 1.0 | 12.4 | 0.67 | 8.3 | 1.00 |
| 0.9 | 13.8 | 0.55 | 7.6 | 0.92 |
| 0.8 | 15.5 | 0.43 | 6.7 | 0.81 |
| 0.7 | 17.7 | 0.32 | 5.6 | 0.67 |
| 0.6 | 20.7 | 0.21 | 4.4 | 0.53 |
| 0.5 | 24.8 | 0.13 | 3.2 | 0.39 |
| 0.4 | 31.0 | 0.07 | 2.1 | 0.26 |
| 0.3 | 41.4 | 0.03 | 1.2 | 0.15 |
| 0.2 | 62.1 | 0.01 | 0.5 | 0.07 |
| 0.1 | 124.1 | 0.00 | 0.1 | 0.02 |

TABLE 2

| Absorption table for 1270 uM (50 mil) thick carbon | | | | |
|---|---|---|---|---|
| λ (angstroms) | Energy (keV) | Fraction Absorbed | Energy Absorbed | Relative Absorption |
| 1.5 | 8.3 | 0.77 | 6.4 | 1.46 |
| 1.4 | 8.9 | 0.70 | 6.2 | 1.41 |
| 1.3 | 9.5 | 0.61 | 5.9 | 1.34 |
| 1.2 | 10.3 | 0.53 | 5.4 | 1.25 |
| 1.1 | 11.3 | 0.44 | 4.9 | 1.13 |
| 1.0 | 12.4 | 0.35 | 4.4 | 1.00 |
| 0.9 | 13.8 | 0.27 | 3.7 | 0.86 |
| 0.8 | 15.5 | 0.20 | 3.1 | 0.71 |
| 0.7 | 17.7 | 0.14 | 2.4 | 0.56 |
| 0.6 | 20.7 | 0.09 | 1.8 | 0.42 |
| 0.5 | 24.8 | 0.05 | 1.3 | 0.30 |
| 0.4 | 31.0 | 0.03 | 0.8 | 0.19 |
| 0.3 | 41.4 | 0.01 | 0.5 | 0.11 |
| 0.2 | 62.1 | 0.00 | 0.2 | 0.05 |
| 0.1 | 124.1 | 0.00 | 0.1 | 0.01 |

TABLE 3

Absorption table for 1270 uM (50 mil) thick aluminum

| λ (angstroms) | Energy (keV) | Fraction Absorbed | Energy Absorbed | Relative Absorption |
|---|---|---|---|---|
| 1.5 | 8.3 | 1.00 | 8.3 | 0.68 |
| 1.4 | 8.9 | 1.00 | 8.9 | 0.72 |
| 1.3 | 9.5 | 1.00 | 9.5 | 0.78 |
| 1.2 | 10.3 | 1.00 | 10.3 | 0.84 |
| 1.1 | 11.3 | 1.00 | 11.2 | 0.92 |
| 1.0 | 12.4 | 0.99 | 12.2 | 1.00 |
| 0.9 | 13.8 | 0.95 | 13.2 | 1.08 |
| 0.8 | 15.5 | 0.89 | 13.7 | 1.12 |
| 0.7 | 17.7 | 0.77 | 13.6 | 1.11 |
| 0.6 | 20.7 | 0.60 | 12.4 | 1.01 |
| 0.5 | 24.8 | 0.41 | 10.2 | 0.83 |
| 0.4 | 31.0 | 0.24 | 7.4 | 0.60 |
| 0.3 | 41.4 | 0.11 | 4.5 | 0.37 |
| 0.2 | 62.1 | 0.03 | 2.1 | 0.17 |
| 0.1 | 124.1 | 0.00 | 0.5 | 0.04 |

Next consider the x-ray flux required to generate 500 nA of leakage current in a reversed bias diode, i.e., diode 16, assuming that all minority carriers are available for capture, i.e., no recombination takes place. Assume that the silicon die has dimensions of 1,270 μm (length)× ×1,270 μm (width)×250 μm (thickness) and further that such a silicon die is covered by a casing whose x-ray absorption is equivalent to that of a 1,270 μm thick layer of graphite. From Tables and 2, we see that for 10 keV x-rays, approximately 0.433 of the x-ray beam energy will be deposited in the semiconductor die based on the above assumption. A current of 500 nA corresponds to approximately $3.12 \times 10^{12}$ minority carriers per second. If the quantum efficiency is 1, each 10 keV photon absorbed by the silicon die will generate 10 keV/3.84 eV or $2.63 \times 10^3$ electron-hole pairs. Consequently, $2.74 \times 10^9$ incident photons per second are required at the package surface. Such a level of incident photons corresponds to a flux of $1.70 \times 10^{15}$ photons per square meter at the package surface. At 10 keV, $10^{12}$ photons per square meter corresponds to a dose of approximately 80 mR. Therefore, an x-ray source capable of furnishing 136 R/s or more at 10 keV should be sufficient for purposes of the present invention. Dose rates of this magnitude are readily obtained near the anode of the typical broad-band industrial x-ray source. In the measurements described below, a FAXITRON 805 x-ray source manufactured and sold by the Hewlett Packard Company of Palo Alto, California was utilized.

Utilizing the FAXITRON 805 for generator 30, a two-volt power supply for source 20 and a 10 megaohm resistor for resistor 24, voltage readings were made across resistor 24 in relation to two 74S00 semiconductor devices and one 74LS00 semiconductor. As the anode potential was increased, changes in the voltage across resistor 24 were observed as follows:

TABLE 2

| Anode Potential (keV) | 74S00 #1 | 74S00 #2 | 74LS00 |
|---|---|---|---|
| 0 | .2 mV | 1.5 mV | .5 mV |
| 10 | .5 mV | | |
| 50 | 4.2 mV | 4.8 mV | 4.0 mV |
| 110 | 4.2 mV | 8.2 mV | 8.0 mV |

It will be noted that source 20 is preferably electrically connected to diode 16 utilizing twisted shielded pair wiring.

It will be noted that for commercial applications, brighter sources and longer working distances would be preferable. It will further be noted that although twisted shielded pair wiring is preferred, other transmission lines such as coaxial cable, which provides both shielding and controlled impedance, could also be utilized.

It has further been discovered that higher leakage currents are achieved by first pumping the semiconductor device with electromagnetic radiation before applying a voltage to the diode. It was found that by first exposing device 12 to electromagnetic radiation, i.e., x-rays, for thirty to sixty seconds before applying the two volt DC voltage, resulted in an higher reading across resistor 24 observed. Such operation of first exposing semiconductor device to electromagnetic radiation and thereafter biasing the diode in a reverse direction, can be achieved through the use of controller 26. Controller 26 would initially actuate generator 30 and thereafter actuate switch 22 to apply the appropriate voltage to diode 16.

While the invention has been described and illustrated with reference to specific embodiments, those skilled in the art will recognize that modification and variations may be made without departing from the principles of the invention as described herein above and set forth in the following claims.

What is claimed is:

1. Apparatus for determining the quality of the mounting of a semiconductor device on a circuit board, the circuit board comprising first and second conductive paths and the semiconductor device comprising first and second leads and a diode effectively formed between said leads, wherein said first lead is associated with said first path and said second lead is associated with said second path , said apparatus comprising:
   a current monitor, connected to monitor the leakage current from said diode; and
   an electromagnetic radiation generator, positioned to provide electromagnetic radiation incident on said semiconductor device, wherein leakage current monitored during the provision of electromagnetic radiation is indicative of mounting quality.

2. Apparatus for determining the quality of the mounting of a semiconductor device on a circuit board, the circuit board comprising first and second conductive paths and the semiconductor device comprising first and second leads and a diode effectively formed between said leads, wherein said first lead is associated with said first path and said second lead is associated with said second path said apparatus comprising:
   a voltage source, electrically connected to said first and second conductive paths, for biasing said diode in a reverse direction;
   a current monitor, connected to monitor the leakage current from said diode; and
   an electromagnetic radiation generator, positioned to provide electromagnetic radiation incident on said semiconductor device, wherein leakage current monitored during the provision of electromagnetic radiation is indicative of mounting quality.

3. The apparatus of claim 2, wherein said electromagnetic radiation comprises ionizing radiation.

4. The apparatus of claim 3, wherein said ionizing radiation comprises X-rays.

5. The apparatus of claim 4, wherein said electromagnetic radiation generator provides said x-rays at an intensity in the range from 10 to 20 kilo electron volts.

6. The apparatus of claim 2, wherein said electromagnetic radiation comprises visible light.

7. The apparatus of claim 6, wherein said visible light comprises a fluorescent source.

8. The apparatus of claim 6, wherein said visible light comprises an incandescent source.

9. The apparatus of claim 2, wherein said source is electrically connected to said diode by twisted shielded pair wiring.

10. The apparatus of claim 2, wherein said voltage source provides a voltage approximately equal to 2 volts.

11. The apparatus of claim 2, wherein said semiconductor device is first exposed to said electromagnetic radiation, and thereafter said voltage source biases said diode in a reverse direction.

12. The apparatus of claim 2, wherein said electromagnetic generator collimates said electromagnetic radiation so that said electromagnetic radiation is incident on only said semiconductor device.

13. A method for determining the quality of the mounting of a semiconductor device on a circuit board, the circuit board comprising first and second conductive paths and the semiconductor device comprising first and second leads and a diode effectively formed between said leads, wherein said first lead is associated with said first path and said second lead is associated with said second path, said method comprising the steps of:
biasing said diode in a reverse direction, by connecting a voltage source to said first and second conductive paths;
monitoring the leakage current from said diode; and
providing electromagnetic radiation incident on said semiconductor device, wherein leakage current monitored during the provision of electromagnetic radiation is indicative of mounting quality.

14. The method of claim 13, wherein the step of providing electromagnetic radiation comprises the step of providing ionizing radiation.

15. The method of claim 14, wherein the step of providing ionizing radiation comprises the step of providing X-rays.

16. The method of claim 15, wherein the step of providing X-rays comprises the step of providing X-rays at an intensity in the range from 10 to 20 kilo electron volts.

17. The method of claim 13, wherein the step of providing electromagnetic radiation comprises the step of providing visible light.

18. The method of claim 17, wherein the step of providing visible light comprises the step of providing a fluorescent source.

19. The method of claim 17, wherein the step of providing visible light comprises the step of providing an incandescent source.

20. The method of claim 13, wherein the step of biasing said diode comprises the step of connecting a voltage source to said diode by twisted shielded pair wiring 21. The method of claim 13, wherein the step of biasing said diode in a reverse direction comprises the step of providing a voltage approximately equal to 2 volts.

22. The method of claim 13, wherein the step of providing electromagnetic radiation incident on said semiconductor device is initiated prior to the step of biasing said diode in a reverse direction.

23. The method of claim 13, wherein said semiconductive device comprises an opaque casing and wherein said electromagnetic radiation comprises a wavelength and an energy level, wherein said step of providing electromagnetic energy comprises providing said energy at a wavelength and at an energy level such that said electromagnetic radiation penetrates said casing and deposits sufficient energy in the semiconductive device to cause a measurable increase in leakage current.

* * * * *